TRAVELING-WAVE SOLID-STATE AMPLIFIER UTILIZING A SEMICONDUCTOR WITH NEGATIVE DIFFERENTIAL MOBILITY

Filed June 21, 1968 4 Sheets-Sheet 1

*INVENTORS*
GORDON S. KINO
PETER N. ROBSON
*BY* Lindenberg & Freilich
ATTORNEYS

INVENTORS
GORDON S. KINO
PETER N. ROBSON
BY Lindenberg + Freilich
ATTORNEYS

*INVENTORS*
GORDON S. KINO
PETER N. ROBSON
*BY* Lindenberg + Freilich
ATTORNEYS

INVENTORS
GORDON S. KINO
PETER N. ROBSON
BY Lindenberg + Freilich
ATTORNEYS

United States Patent Office 3,551,831

Patented Dec. 29, 1970

3,551,831

TRAVELING-WAVE SOLID-STATE AMPLIFIER UTILIZING A SEMICONDUCTOR WITH NEGATIVE DIFFERENTIAL MOBILITY

Gordon S. Kino, Stanford, Calif., and Peter N. Robson, Sheffield, England, assignors to Research Corporation, New York, N.Y., a non-profit corporation of New York Filed June 21, 1968, Ser. No. 739,072

Int. Cl. H03f 3/14

U.S. Cl. 330—5 14 Claims

ABSTRACT OF THE DISCLOSURE

A distributed two-port, traveling-wave solid-state amplifier using the transferred electron mechanism in certain semiconductor compounds is provided with two electrodes alloyed to ends of a specimen of N-type gallium arsenide so biased as to provide an electric field over most of its length, and two probes, one to inject a signal near the most negative point in the field, and the other to extract the signal near the most positive point in the field with a gain of 2 to 4 db in the 700 to 1500 mHz. frequency range.

BACKGROUND OF THE INVENTION

The invention described herein was made in the performance of work under a NASA contract and is subject to the provisions of Section 305 of the National Aeronautics and Space Act of 1958, Public Law 85–568 (72 Stat. 435; 42 U.S.C. 2457).

This invention relates to an amplifier, and more particularly, to a traveling-wave amplifier using a semiconductor tor device having a region of negative differential mobility in its drift velocity electric field characteristic, and having means for inhibiting oscillation.

Traveling-wave amplification in a semiconductor so biased with DC voltage as to give rise to a region of negative differential mobility in its drift-velocity electric field characteristics has been reported in the literature by H. W. Thim et al., in an article titled, Microwave Amplification in a D.C.-Biased Bulk Semiconductor published Sept. 15, 1965 in Applied Physics Letters, vol. 7, No. 6 at pages 167 and 168. For a theoretical discussion of the mechanics involved in such amplification see "Linear, or 'Small-Signal,' Theory for the Gunn Effect" by R. W. H. Engelmann et al., in IEEE Transactions on Electronic Devices, vol. 13, No. 1 (January 1966) at pages 44 to 52 and "Amplification in Two Valley Semiconductors" by B. W. Hakki published in the Journal of Applied Physics, vol. 38, No. 2 (1967) at pages 808 to 818. However, the devices which have been investigated with respect to their narrow band reflection amplification have consisted of suitably doped gallium arsenide diodes, and the like, approximately one space-charge wave-length long.

In the theory given by these authors, and others, it is shown that the total RF field within the amplifying devices consists of two parts: (1) a space charge wave component with a phase velocity approximately equal to the electron drift velocity, and an amplitude which increases along the length of the device; and (2) an essentially uniform RF field component associated with the total current flowing through the diode. However, it would seem that such a diode amplifier is limited in use since only two electrodes are available.

OBJECTS AND SUMMARY OF THE INVENTION

An object of this invention is to provide a two-port unilateral, traveling-wave, solid-state amplifier having separate input and output terminals.

According to the invention, a two-port, traveling-wave, solid-state amplifier is provided with two spaced apart electrical contacts on a semiconductor body of the type referred to hereinbefore to provide an electric field in the body between the contacts, and two probes, one to inject an AC signal at or near the most negative point in the field and the other to extract the amplified signal at or near the most positive point in the field.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
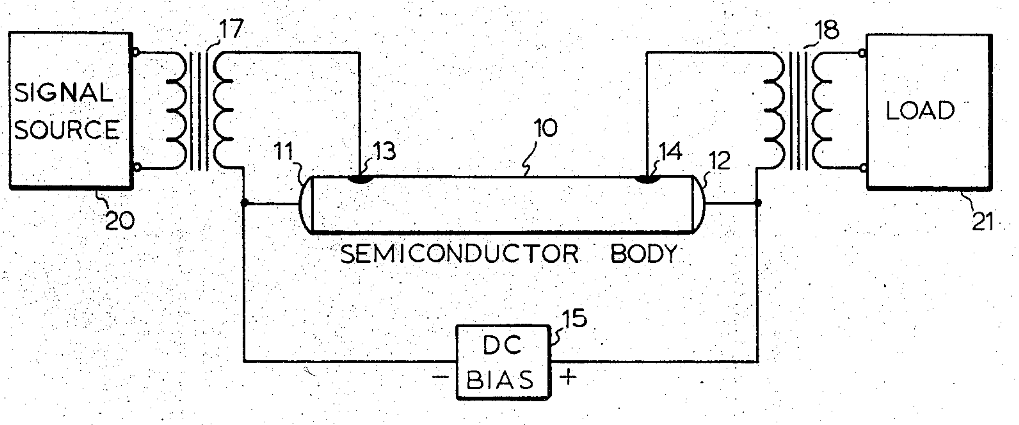
FIG. 1 is a schematic diagram of a first embodiment of the invention.
Figure 2:
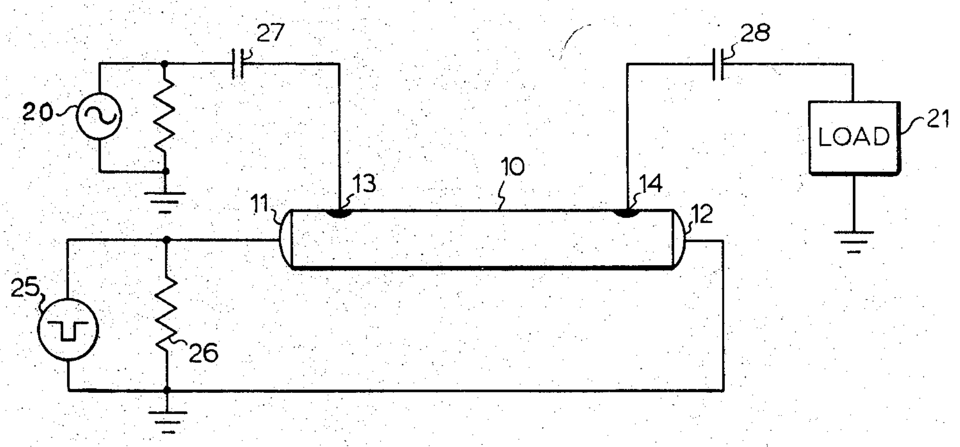
FIG. 2 is a schematic diagram of a second embodiment of the invention.

In preferred embodiments of the invention as shown in FIGS. 1 and 2, the transferred electron mechanism in a semiconductor body 10 of gallium arsenide, or other known compounds such as indium phosphide and cadmium telluride referred to in the literature cited hereinbefore, gives rise to a region of negative differential mobility in its drift velocity electric field characteristic. When biased in this region of the characteristic, the semiconductor body can support a growing, small signal, longitudinal space charge wave. If the differential mobility is negative a signal injected at one end can grow with distance along the semiconductor body and change in phase.

High resistivity material is preferred for the semiconductor body 10 to reduce the space charge growth rate therein in order that it may be made stable against oscillations which normally occur when the $n$L product is greater than $5\times10^{11}/\text{cm.}^2$ where $n$ is the carrier density in the material and L is the length of the semiconductor body. With low resistivity materials, the growth rate is very large so that the $n$L product is greater than $5\times10^{11}/\text{cm.}^2$ and the semiconductor body will oscillate, unless L is kept very small or other measures are taken to inhibit oscillation.

In accordance with the present invention, a suitable length L, such as 0.6 to 1 mm. for GaAs in the resistivity range 600 to 3000 ohm-cm., is selected to be able to place an ohmic source contact 11 at or near one end of the semiconductor body and an ohmic drain contact 12 at or near the other end of the semiconductor body with a probe 13 near the contact 11 and a probe 14 near the contact 12. A width and thickness of about 0.5 and 0.3 mm. may be employed for the device 10. The probes may be either in ohmic contact with the semiconductor body 10 or in non-ohmic contact (e.g., Schottky barrier, reverse biased PN junction, capacitive coupling and the like) and may be biased externally with respect to the source and drain contacts as shown in FIG. 2. The contacts 11 and 12 are preferably Au Ge contacts vapor deposited.

Referring now only to the embodiment illustrated in FIG. 1, a source 15 of D.C. bias potential is connected to the contacts 11 and 12 with the polarity shown to establish an electric field through the semiconudctor body 10. The probes 13 and 14 are biased with the same potentials through windings of transformers 17 and 18. The primary winding of the transformer 17 is connected to a signal source 20 to inject an input signal at the probe 13. The secondary winding of the transformer 18 is connected to a load 21 to extract an output signal from the semiconductor body 10 through probe 14 coupled thereto.

In operation, a signal injected by the probe 13 in the range of about 750 to 1500 mHz. is amplified as it is propagated through the semiconductor body 10 in the field established by the DC bias source 15 applied to the contacts 11 and 12. The input signal injected between the probe 13 and the contact 11 causes the charge density in the region between the injection probe 13 and the extraction probe 14 to be modulated. This modulation is carried by drifting carriers within the semiconductor body towards the extraction probe 14 and is amplified as it progresses toward the extraction probe 14 due to the differential mobility of the bulk semiconductor. The amplified signal is extracted between the probe 14 and the contact 12.

The growth rate of the modulation is essentially independent of frequency up to a very high frequency so that the band width of the amplifier is determined by the input and output coupling circuits, which is to say the transformers 17 and 18 and the circuits coupling the transformers to the signal source 20 and load 21. The present state of the art will permit such coupling to the probes 13 and 14 to be so designed as to render the amplifier useable over a 10% bandwidth, but it should be possible to use these techniques to obtain broadband operation over an octave or more. For stability, the material for the semiconductor body 10 is so selected as to provide an $n$L product of less than $5\times10^{11}$/cm.$^2$. Otherwise, other measures may be required to assure stability as will be described hereinafter.

An example of suitably doped material is a sample of Monsanto oxygen doped gallium arsenide with donor densities in the range of $3\times10^{11}$ to $4\times10^{12}$/cm.$^3$ one millimeter long and 0.75 millimeters square. The $n$L product of such material is always less than $4\times10^{11}$/cm.$^2$ which is well below the critical concentration of about $5\times10^{11}$/cm.$^2$.

Referring now to the embodiment of FIG. 2, the semiconductor body 10 is biased between the contacts 11 and 12 by a 600 nanosecond negative pulse from a source 25 connected in parallel with a resistor 26. The repetition rate of the pulses from the source 25 may be in the order of 50 pulses per second. Thus, an electric field is established across the semiconductor periodically. For best results, the semiconductor should be uniformly doped in order that the space charge in the field may increase monotonically from the contact 11 to the contact 12.

The quality of the sample may be checked by using a fine capacitive probe of the type described by Gunn et al., Physics Letters, vol. 22 (1966) at page 369, fed to a high impedance input sampling oscilloscope. Uniform doping density is indicated by the linear increase in potential with distance as the capacitive probe is moved along the semiconductor body 10. However, because the biasing field along the semiconductor body 10 is not uniform with distance, the drift velocity and space charge density of the electrons will also be non-uniform with distance. Accordingly, a small signal RF theory which takes into account the non-uniformity of the biasing fields has been developed which neglects diffusion, as may be done for high resistivity material. That theory permits expression of desired results in analytical form over most of the range of interest. For that purpose, the velocity-field characteristic may be represented by the expression $1/v=A+BE$ where the differential mobility is negative, A and B are constants, E is the magnitude of the biasing field at a plane Z and $v$ is the electron drift velocity at the plane Z.

Figure 7:
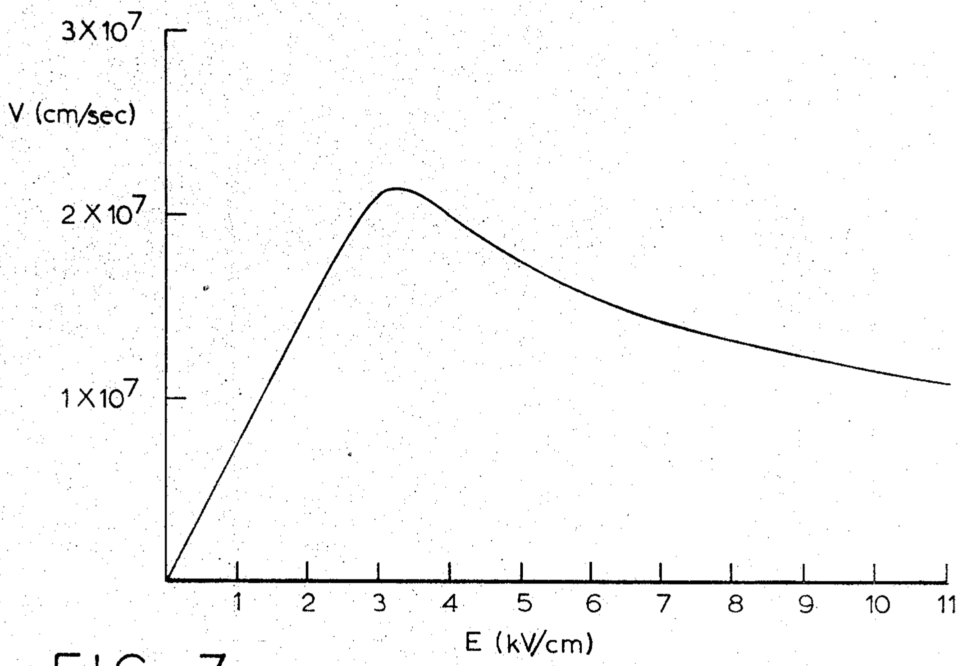
FIG. 7 is a graph illustrating the velocity field characteristic of the semiconductor body employed in the embodiments of FIGS. 1 and 2.

FIG. 7 illustrates data for the velocity-field characteristic of a gallium arsenide sample having a resistivity of $10^6$ ohm per centimeter. To satisfy the foregoing expression involving velocity $v$ and field E, the constants A and B are $2.5\times10^{-8}$ second per centimeter and $0.64\times10^{-11}$ seconds per volt, respectively. The use of that expression makes it possible to express the phase delay of the RF space charge wave in the following form:

$$\theta=(Al+BV)$$

where $l$ is the distance between the two points of interest and V the potential difference between them. Typically, the distance $l$ corresponds fairly closely to the length of the semiconductor body 10. Accordingly, it may be concluded that the phase delay of the space charge wave should be linearly proportional to voltage whatever the distribution of the donor density.

It can be similarly shown that the signal grows exponentially with distance whatever the variation of the donor density.

Figure 8:
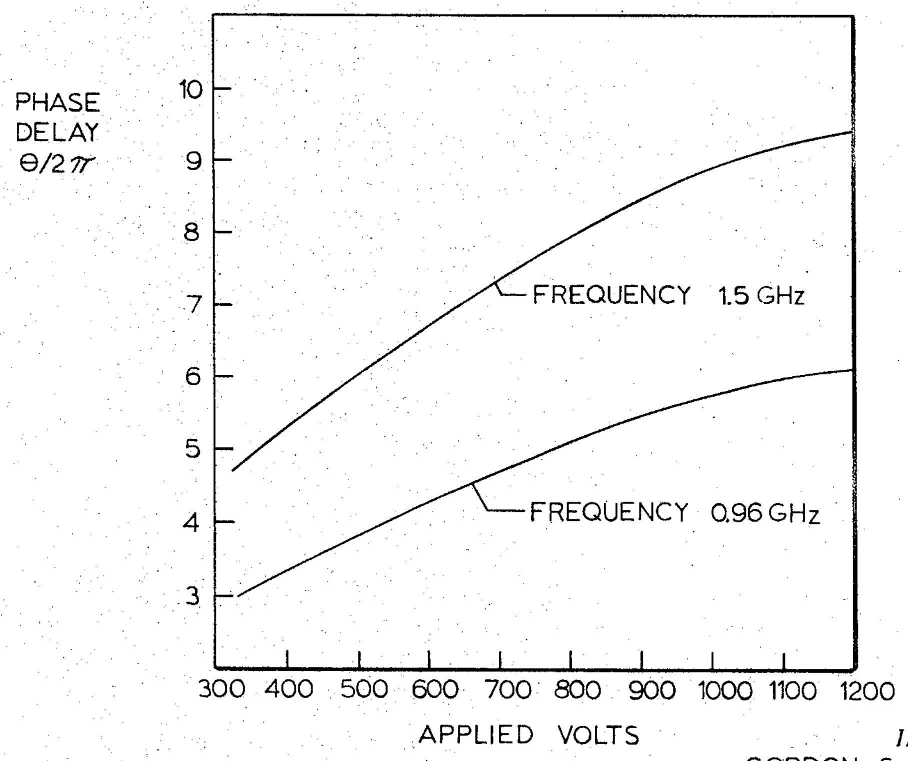
FIG. 8 is a graph illustrating the phase delay between injection and ejection probes in the embodiments of FIGS. 1 and 2 as a function of applied bias voltage for two different frequencies.

FIG. 8 shows data of phase delay between input and output probes spaced 710 microns apart as a function of the applied bias voltage for two different frequencies, 960 gHz. and 1.5 gHz. for a specimen with the $n$L product equal to $8\times10^{10}$/cm.$^2$. The measured phase delay is seen to increase linearly with bias voltage up to approximately 900 volts of applied bus voltage. Above this point, the departure from linearity becomes evident as the drift velocity saturates and the velocity-field approximation given by $1/v=A+BE$ is no longer valid. The theoretical and experimental results are in excellent agreement.

Figure 9:
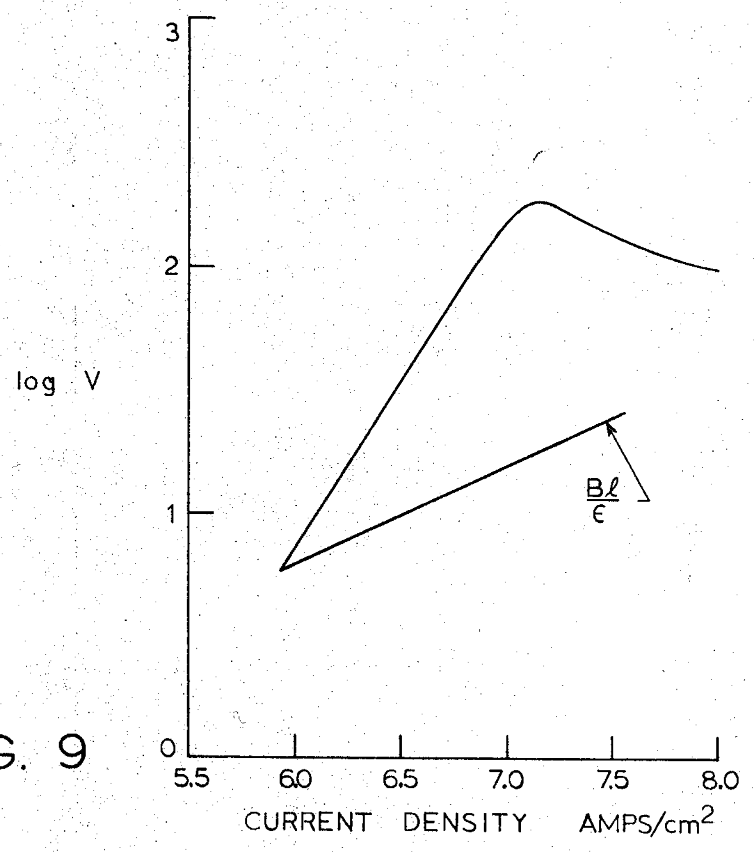
FIG. 9 is a graph of the logarithm of the output of signal voltage with respect to bias current density at a frequency of 960 mHz. for the embodiment illustrated in FIG. 2.

In FIG. 9, the logarithm of the output $rf$ signal voltage is plotted with respect to bias current density at a frequency of 960 mHz. A line of slope $Bl/\epsilon$ where $B=0.64\times10^{-11}$ secs./volt is plotted alongside the experimental curve. It will be seen that the slope of the actual curve in the linear region is greater than the theoretical one. This is attributed to the variation of coupling to the wave as the field distribution along the sample changes in the vicinity of the couplers. The eventual sudden decrease in gain with current is considered to be caused by the onset of saturation in the velocity field characteristic and the breakdown of the approximation given by $1/v=A+BE$.

Figure 10:
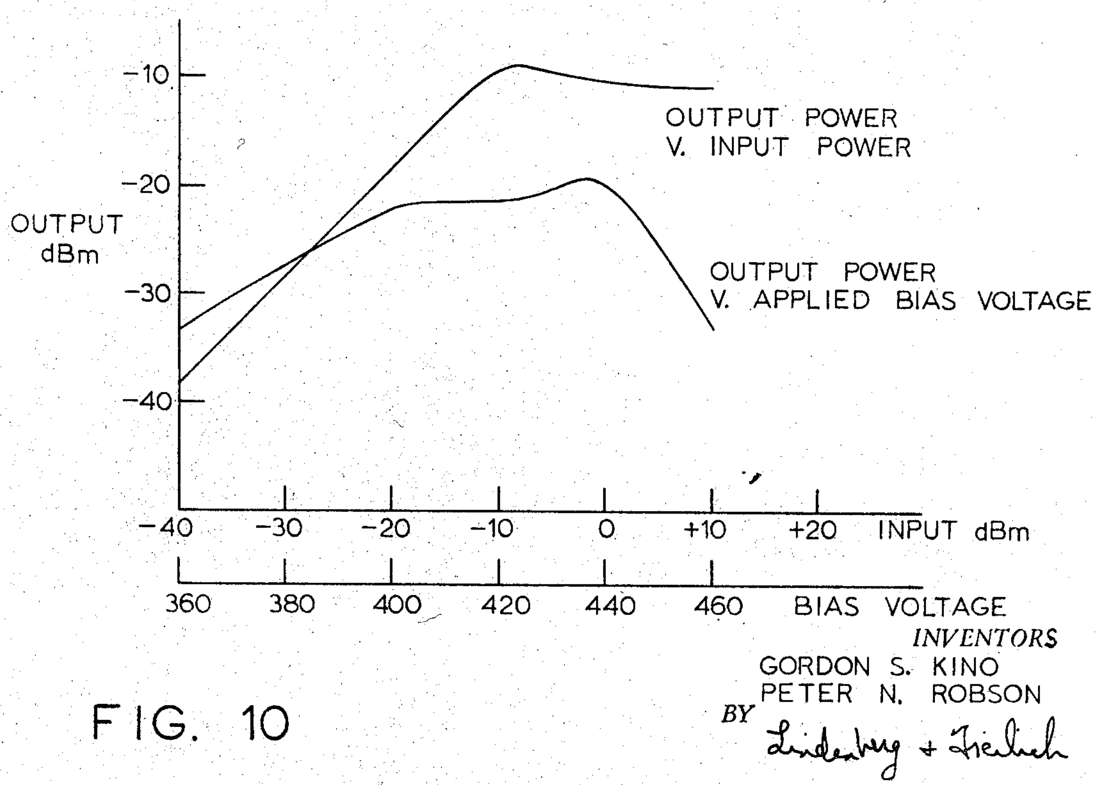
FIG. 10 is a graph of output power as a function of input power for the embodiment illustrated in FIG. 2.

Results of power measurements for the embodiment of FIG. 2 taken at 960 mHz. for a device with $nL=2.9\times10^{11}$/cm.$^2$, $L=860$ microns and a spacing from center to center of the input and output contacts of $l=640$ microns are shown in FIG. 10. A net saturated gain of 2 db. is indicated with a saturated output power of −10 dbm. In the same figure a plot of the variation of output power with respect to bis voltage, with an input power of −20 dbm. is given. Similar results have been obtained at frequencies in the range from 800 mHz. to 1.5 gHz. In all cases, the input and output contacts were connected through small capacitors 27 and 28 (FIG. 2) to 50 ohm coaxial input and output leads, and no timing of any kind was used.

Figure 3:
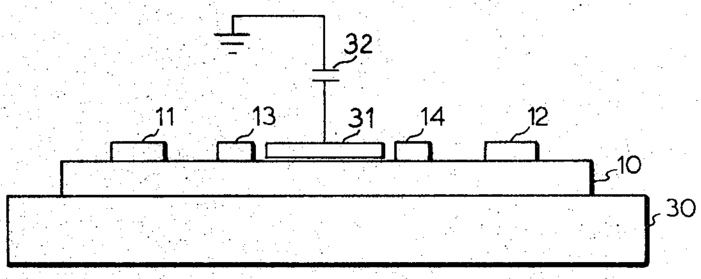
FIGS. 3 and 4 are variants on the geometry to be employed in the embodiments of FIGS. 1 and 2.
Figure 4:
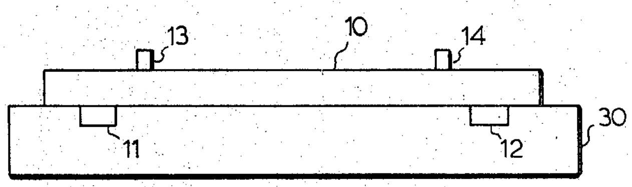

FIGS. 3 and 4 illustrate variants on the geometry of the device 10 shown in FIGS. 1 and 2. Corresponding elements are identified by the same reference numerals to facilitate understanding the variants. In each, a semiconductor body 10 is provided on an insulating crystalline substrate 30. That may be accomplished in a number of different ways known to those skilled in the technology of integrated circuits. For example, the substrate 30 may be crystalline material vapor deposited on the semiconductor body 10 or the semiconductor body 10 may be epitaxial material deposited on an insulating substrate 30 of like material. To improve the electrical isolation of the body 10, an insulating film may first be provided, such as by oxidizing the surface of the body 10 before depositing the substrate 30. The top of the body 10 is then cleaned by etching or lapping the body 10 to the desired thickness (about 0.3 mm.) before contacts 11, 12 and probes 13, 14 are provided in a suitable manner, as by vapor deposition techniques. In the case of the variant illustrated in FIG. 4, the contacts 11 and 12 are deposited on the semiconductor body 10 before the substrate 30 is deposited. The exact length (about 0.6 mm.) and with (about 0.5 mm. for n-type GaAs in the resistivity range of 600 to 3000 ohm–cm.) of the body 10 is then provided, as by etching the excess away. The remaining substrate facilitates mounting in a suitable package to provide a fully practicable device.

Figure 5:
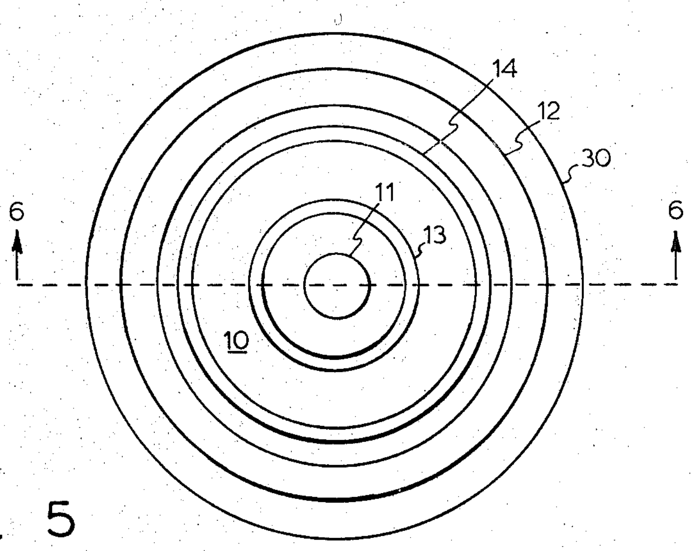
FIGS. 5 and 6 illustrate still another variant on the geometry to be employed for the embodiments of FIGS. 1 and 2.
Figure 6:
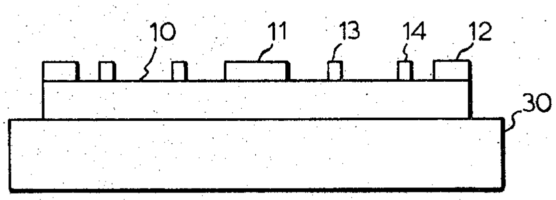

FIG. 5 illustrates yet another variant which provides concentric annular contacts 11, 12 and probes 13, 14 on a semiconductor body 10 as shown in a plan view. FIG. 6 shows a sectional view of this variant taken on the line 6—6 in FIG. 5. Aside from the advantage of having a greater drain contact 12 than a source contact 11 with a greater extraction probe 14 than an injection probe 13, there is the added advantage of being able to employ a coaxial cable to couple to the contacts and probes.

In all of these variants, capacitive coupling could be employed for the injection and extraction probes 13 and 14, but ohmic coupling has been found to provide greater net gain. Other possible arrangements for the probes may be readily devised to practice the present invention. For example, an input signal may be injected through the source contact 11 and extracted through the drain contact 12 with suitable capacitors coupling the signal source and the load to the contacts. An advantage is that low resistivity material may then be used since it would no longer be necessary to keep the length L large. To illustrate, if L is about 20 microns, then $n$ may be about $2\times10^{14}/\text{cm.}^3$ to achieve the same $n$L product as with the high resistivity material 1 millimeter long in the example given hereinbefore. This is important because at the present time low resistivity material is more readily available than high resistivity material. To bias the contacts with a D.C. voltage source, it would be a simple matter in such an arrangement to connect the drain contact to the positive pole of a battery with an RF choke coil and the source contact to the negative pole of the battery with another RF choke coil. In that manner the RF signal capacitively coupled to and from contacts would be isolated from the bias voltage source.

Another measure which may be taken to inhibit oscillations besides keeping the $n$L product below $5\times10^{11}/\text{cm.}^2$ is to keep the thickness of the material to, for example, 1 to 5 microns. That is quite feasible by epitaxially growing the material on an insulating substrate of the same material. It has been theoretically shown that oscillations are inhibited in such a thin body because of its small thickness, even if the $n$L product were greater than $5\times10^{11}/\text{cm.}^2$. It is believed that the criterion for inhibition of oscillation with small thickness is an $nd$ product less than $2\times10^{11}/\text{cm.}^2$ where $d$ is the thickness of the semiconductor body. That criterion has the advantage of permitting the use of low resistivity material in a practical device, preferably using the arrangement just described for injecting and extracting signals through the source and drain contacts, instead of through separate probes.

Oscillations can be still further inhibited if a metal layer is placed on top of a thin epitaxial layer of semiconductor material, although not in ohmic contact with it, as illustrated by a metal layer 31 in the variant illustrated in FIG. 3. The metal layer 31 is connected to ground by a capacitor 32 so that it tends to shunt RF fields to ground but not D.C. fields, thereby lowering gain per unit length and allowing one to use thicker layers of epitaxial material.

In practice, the metal layer 31 is deposited directly on the epitaxial material 10, forming a Schottky barrier. However, to avoid arcing problems and troubles with the non-uniform D.C. potential underneath the Schottky barrier, a thin insulating layer less than one micron thick is deposited before vapor depositing the metal layer.

Instead of employing probes 13 and 14 to inject and extract signals, the arrangement described hereinbefore may be employed to inject and extract signals through the contacts 11 and 12. The metal layer 31 should then be extended to each of the contacts, leaving only a small gap therebetween. Use of the combination of both such an input-output system and the metal plate provides great versatility in design for different applications or operating requirements with different semiconductor bodies, thick or thin, long or short and of high or low resistivity.

What is claimed is:

1. A traveling-wave, solid-state amplifier comprising:
- a semiconductor body which exhibits a region of negative differential mobility in its drift-velocity electric field characteristic and which has a predetermined physical characteristic selected to inhibit oscillation in said body for amplification of an A.C. signal;
- first and second spaced apart electrical contacts on said body;
- biasing means connected to said first and second spaced apart contacts for providing an electric field biasing said body in said negative differential mobility region with said first contact at the negative end of said field;
- first means for injecting said A.C. signal into said semiconductor body at said negative end of said field; and
- second means for extracting an amplified A.C. signal from said semiconductor body at said positive end of said field.

2. A traveling-wave, solid-state amplifier as defined in claim 1 wherein said first means comprises a first probe adjacent said first contact and said second means comprises a second probe adjacent said second contact.

3. A solid-state amplifier as defined in claim 2 wherein said first means further comprises a signal source and a transformer having its primary winding connected to said signal source and its secondary winding connected between said first probe and said first contact, and wherein said second means further comprises a transformer having its primary winding connected between said second probe and said second contact.

4. A solid-state amplifier as defined in claim 2 wherein said first means further comprises a signal source capacitively coupled to said first probe and said second means further comprises a load capacitively coupled to said second probe.

5. A solid-state amplifier as defined in claim 3 wherein said biasing means comprises a source of D.C. potential connected in series between said contacts.

6. A solid-state amplifier as defined in claim 4 wherein said biasing means comprises a pulse source connected in series between said contacts.

7. A solid-state amplifier as defined in claim 2 wherein said physical characteristic is an $n$L product less than approximately $5\times10^{11}/\text{cm.}^2$ for said body and a material for said body is chosen to have sufficiently high resistance to permit said body to have sufficient length between said contacts to place said probes and yet keep the product $n$L less than approximately $5\times10^{11}/\text{cm.}^2$, where $n$ is the carrier density in the material and is the length of the body between said contacts.

8. A solid-state amplifier as defined in claim 1 wherein said physical characteristic is a thickness for said body in one direction normal to a surface between said first means and said second means selected to be sufficiently thin to inhibit oscillation.

9. A solidstate amplifier as defined in claim 8 wherein the thickness of said layer is chosen to be between approximately 1 to 5 microns to inhibit oscillation therein.

10. A solid-state amplifier as defined in claim 1 including a metal layer disposed between said first and second means, but not in ohmic contact with said body, and means connecting said metal layer to circuit ground for shunting RF fields to circuit ground but not D.C. fields, thereby lowering gain per puit length of said body between said first and second means to allow for greater thickness of said body without oscillation in said body.

11. In a signal translating device, a semi-conductor body which exhibits a region of negative differential mobility in its drift-veleocity electric field characteristic in response to a biasing electric field between first and second spaced apart electrical contacts on said body, means for injecting an AC signal into said semiconductor body at the negative end of said field, means for extracting an AC signal from said semiconductor body at the positive end of said field, and means for inhibiting oscillation in said device between said signal injecting means and said signal extracting means, whereby said AC signal injected is amplified between said signal injecting means and said signal extracting means.

12. In a signal translating device, the combination defined by claim 11 wherein said means for inhibiting oscillation comprises an *n*L product for said body less than approximately $5\times10^{11}/\text{cm.}^2$, where *n* is the carrier density in the material and L is the length of the body between said contacts.

13. In a signal translating device, the combination defined by claim 11 wherein said means for inhibiting oscillation comprises a thickness for said body in one direction normal to a surface between said signal injecting means and said signal extracting means selected to be sufficiently thin to provide an *nd* product of less than approximately $2\times10^{11}/\text{cm.}^2$ to inhibit oscillation where *n* is the carrier density in the material and *d* is said thickness.

14. In a signal translating device, the combination defined by claim 11 wherein said means for inhibiting oscillation comprises a metal layer disposed between said means for injecting an A.C. signal into said semiconductor body at the negative end of said field and said means for extracting an A.C. signal from said semiconductor body at the positive end of said field, but not in ohmic contact with said body, and means connecting said metal layer to circuit ground for shunting RF fields to ground, thereby lowering gain per unit length of said body between said injecting means and said extracting means.

References Cited

UNITED STATES PATENTS

| | | | |
|---|---|---|---|
| 3,401,347 | 9/1968 | Sumi | 330—5 |
| 3,451,011 | 6/1969 | Uenohara | 330—5X |
| 3,464,020 | 8/1969 | Koyama et al. | 330—56X |

FOREIGN PATENTS

| | | | |
|---|---|---|---|
| 1,110,338 | 4/1968 | Great Britain | 331—107(G) |

OTHER REFERENCES

Robson et al., "Two-Port Microwave Amplification in Long Samples of Gallium Arsenide," IEEE Transactions On Electron Devices, September 1967, pp. 612–615 (331—107G).

Thim, "Temperature Effects in Bulk GaAs Amplifiers," IEEE Transactions On Electron Devices, vol. ED–14, No. 2, February 1967, pp. 59–62 (331—107G).

ROY LAKE, Primary Examiner

S. H. GRIMM, Assistant Examiner

U.S. Cl. X.R.

317—234; 330—34, 35, 38